United States Patent [19]

Schwindt

[11] Patent Number: 4,525,015

[45] Date of Patent: Jun. 25, 1985

[54] PREASSEMBLED PRESS FIT CONNECTOR WITH ASSEMBLY INSERT

[75] Inventor: Gary W. Schwindt, Washington, Conn.

[73] Assignee: Litton Systems, Inc., Watertown, Conn.

[21] Appl. No.: 526,308

[22] Filed: Aug. 25, 1983

Related U.S. Application Data

[63] Continuation of Ser. No. 264,584, May 18, 1981, abandoned.

[51] Int. Cl.$^3$ .............................................. H05K 1/00

[52] U.S. Cl. ................................ 339/17 C; 339/17 R; 339/75 M; 339/221 M

[58] Field of Search ...... 339/221 R, 176 MP, 75 MP, 339/17 L, 17 LC, 17 LM; 29/837, 838, 845, 884, 741

[56] References Cited

U.S. PATENT DOCUMENTS 4,089,104 5/1978 Barry et al. .......................... 29/739
4,209,216 6/1980 Brooks ................................. 79/741

OTHER PUBLICATIONS

Hudson et al, "Guide Assembly for Pin Insertion Press Blocks", Jan. 1981, pp. 13–14.

*Primary Examiner*—Gil Weidenfeld
*Assistant Examiner*—David L. Pirlot
*Attorney, Agent, or Firm*—Brian L. Ribando

[57] ABSTRACT

A preassembled press fit connector and method of mounting the same on a printed circuit board in an array of plated thru holes comprises a selectively configured connector housing and first and second adjacent rows of contacts mounted within the housing. Each contact has a press shoulder portion within the housing and a press fit section extending downwardly below of the housing. A removable insert includes a plate portion for defining an external connector press surface above the housing and first and second rows of integral teeth extending downwardly into the housing. The rows of teeth engage one each with the press shoulder portions of the first and second row of contacts. This allows the press fit sections of the contacts to be simultaneously forced into mating engagement with the plated thru holes of the printed circuit board by applying pressure to the external connector press surface presented by the removable insert.

3 Claims, 2 Drawing Figures

PREASSEMBLED PRESS FIT CONNECTOR WITH ASSEMBLY INSERT

BACKGROUND OF THE INVENTION

This is a Continuation of U.S. Pat. application Ser. No. 264,584, filed May 18, 1981, now abandoned.

The present invention relates to preassembled press fit connectors.

Preassembled press fit connectors, which comprise a plastic housing and a plurality of press fit contacts mounted therein, are well known in the art. Press fit contacts rely on a tight fitting mechanical mating engagement with plated thru holes on a circuit board in order to establish electrical contact therewith. The force required to mate the contacts of the preassembled connector with the circuit board generally cannot be applied to the connector housing without damaging the connector. Conventionally, a plurality of connectors are mounted on a circuit board by a press having rigidly mounted thereto a comb-shaped tool head which enters each connector housing to individually engage and exert a pressing force simultaneously on each of the press fit contacts therein.

The above-described assembly operation is not well suited to the needs of a manufacturer of electronic equipment who desires to use preassembled press fit connectors in a manufacturing operation. Each connector must be precisely aligned with both the press head and the circuit board before the actual pressing begins in order to achieve satisfactory results. This requires skill on the part of the press operator, and the alignment process is time consuming and thus costly. Additionally, the comb shaped tool is expensive, i.e. in the range of $500—$1,000, and will fit only one size connector. Thus, if the manufacturer assembles only a small number of connectors onto circuit boards, and such connectors are of 3 or 4 different sizes, the cost of tooling becomes prohibitive.

Another prior art approach is shown in U.S. Pat. No. 4,089,104 issued to Barry et al, and assigned to the same assignees as the instant invention. As taught by Barry et al, a press fit connector may be preassembled on the insertion tool itself, after which the tool, which is mounted on a press head, may be employed to press the connector into a circuit board. The Barry et al device suffers the same drawbacks as the other prior art, i.e. the insertion tool is costly, and the assembly and pressing process is slow.

OBJECTS OF THE INVENTION

It is therefore an object of the present invention to provide preassembled press fit connectors which facilitate the connector mounting operation.

It is another object of the invention to provide an insert for use with preassembled press fit connectors which obviates the need for specialized tooling normally required for pressing such connectors into a printed circuit board.

It is another object of the invention to provide preassembled press fit connectors having external press surfaces which may be gang pressed into a printed circuit board.

Other objects and advantages of the present invention will become apparent from the following portion of the specification and from the accompanying drawings which illustrate, in accordance with the mandate of the patent statutes, a presently preferred embodiment incorporating the principles of the invention.

DESCRIPTION OF THE PREFERRED EMBODIMENT

Figure 1:
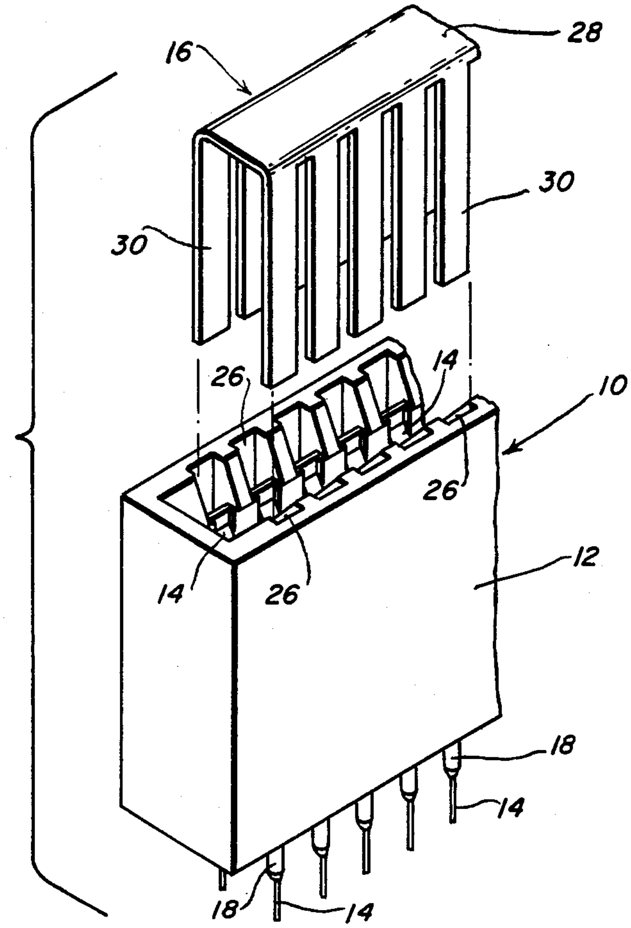
FIG. 1 is an exploded perspective view of a preassembled press fit connector according to the teachings of the present invention.

Referring now to the drawing figures, a connector 10 generally comprises a plastic housing 12, two adjacent rows of press fit contacts 14 mounted therein, and a removable insert member 16.

The contacts 14 each include a press fit section 18 extending below the housing 12 and a press shoulder 20 within the housing 12 to which a force must be applied in order to mate the press fit section 18 with a plated thru hole 22 of a printed circuit board 24. Vertical slots 26 within the housing 12 provide access to the press shoulders 20 from above.

The insert member 16 is made from a single piece of thin sheet stock which has an inverted "U" shape. The insert 16 comprises a plate portion 28 and first and second rows of integrally formed teeth 30. The plate portion 28 defines an external press surface which is situated above the plastic housing 12 when the insert is positioned within the connector 10. The first and second rows of teeth 30 extend downwardly into the housing slots 26 and individually engage the press shoulders 20 of the respective rows of connector contacts 14.

METHOD OF USE OF THE PREFERRED EMBODIMENT

Figure 2:
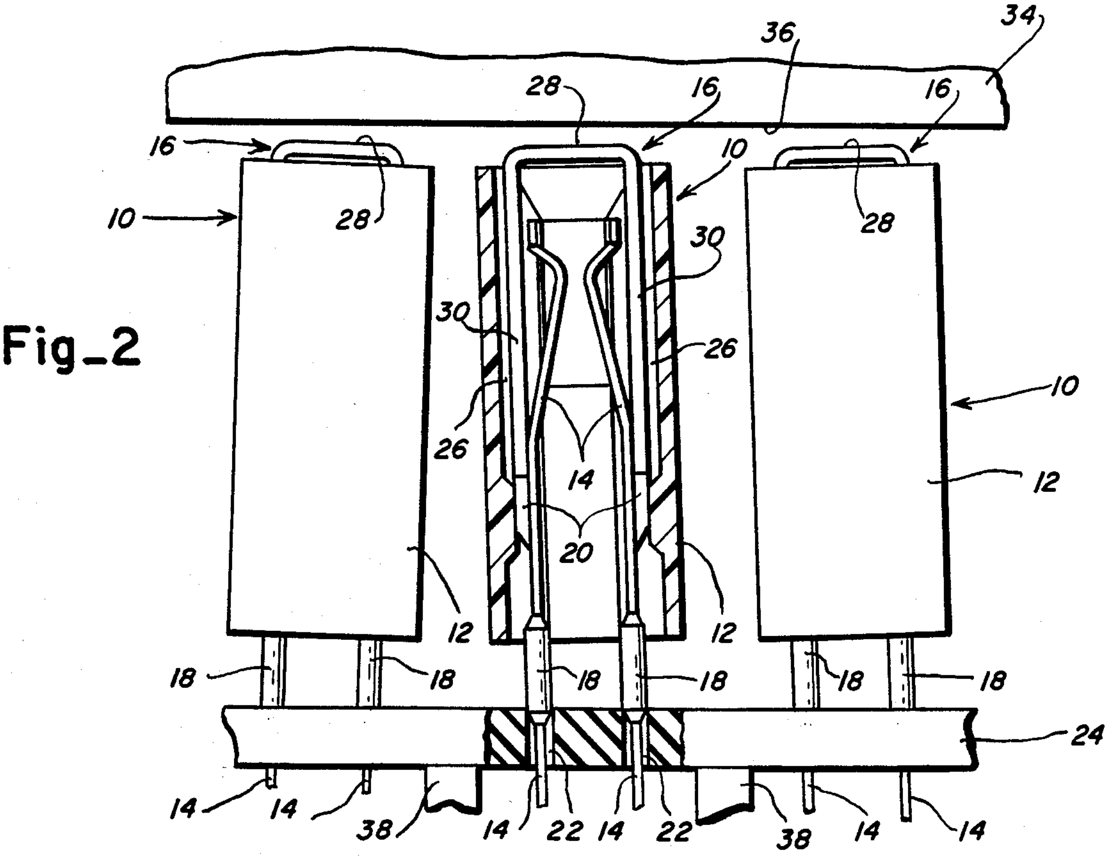
FIG. 2 is a side view partially sectioned of a plurality of preassembled press fit connectors on a printed circuit board prior to pressing.

A plurality of connectors 10 may be pre-loaded onto a printed circuit board 24 by loosely inserting the connectors 10 into the plated through holes 22 of the circuit board as shown in FIG. 2. The circuit board 24 is positioned on a suitable support 38 which is located below a press block 34. The press block is used without auxiliary tooling and comprises a smooth and flat pressing surface 36 which is parallel to the printed circuit board 24. Since the flat pressing surface 36 does not enter the connectors 10, a plurality of connectors of several sizes may be pressed at one time, and may be initially skewed with respect to the circuit board 24. Lowering the press block 34 causes the pressing surface 36 to contact the plate portions 28 of the inserts, and the force of the press is transmitted from the plate portions 28 to the press shoulders 20 by the teeth 30. Although the teeth 30 are formed from the same thin sheet stock as the plate portion 28, constraint of the teeth by the vertical housing slots 26 enables the teeth 30 to effectively transmit the force from the press block 34 to press shoulders 20. Continued lowering of the press block 34 causes the press fit sections 18 of the contacts 14 to be seated in the plated through holes 22, automatically straightening and aligning each of the connectors 10. After the connectors 10 are mounted in the board 24, the inserts 16 are removed and, owing to their inexpensive design, discarded.

Through the use of the invention, preassembled press fit connectors may be pressed into a printed circuit board without the use of costly, auxiliary tooling. Moreover, insertion of the connectors is simplified since a plurality of connectors may be mounted on a circuit board simultaneously, without the need to precisely align each of the connectors either with the press head or with the circuit board.

What is claimed is:

1. A preassembled press fit connector for mounting on a printed circuit board in an array of plated thru holes comprising:

a selectively configured connector housing, first and second adjacent rows of contacts mounted within said housing, a press shoulder formed on each said contact within said housing, a press fit section formed on each said contact extending downwardly below said housing, and a removable insert formed from thin sheet stock and having an inverted U shape mounted within said housing and being axially supported soley by said first and second rows of contacts, said insert means comprising:

a plate portion defining an external connector press surface above said housing, and first and second rows of integral teeth extending downwardly from said plate portion and engaging one each with said press shoulders of said first and second rows of contacts, whereby a force applied to the external press surface of the insert is transfered by said first and second rows of integral teeth and whereby the press fit sections of a plurality of press fit connectors may be simultaneously forced into mating engagement with the plated thru holes of the printed circuit board by applying pressure with the flat pressing surface of a press head to the external connector press surfaces presented by the removable inserts in said plurality of preassembled press fit connectors, said press head being withdrawn from said connector independently of said removable insert whereby the press head must be withdrawn from said removable insert prior to said removable insert being removed from said connector.

2. The preassembled press fit connector of claim 1, further comprising:

vertical housing slots providing access to said contact press shoulders from the top surface of the connector housing, said vertical housing slots constraining the teeth of the removable insert whereby said thin teeth are able to transmit force from said press head to said press shoulders.

3. A method for mounting a plurality of preassembled press fit connectors onto a printed circuit board having rows of plated thru holes, each connector having a removable insert formed from thin sheet stock, having the shape of an inverted U, and defining a flat, external press surface on the top of each connector comprising:

loosely inserting a plurality of connectors into the rows of thru holes of the circuit board, applying a pressing force to the flat connector press surfaces of the loosely inserted connectors with press means having a flat press surface which is parallel to the circuit board and nonfixed to and movable independently of said removable insert press surface, withdrawing the press means flat press surface from the removable insert press surface, removing the inserts from the connectors.

* * * * *